United States Patent
MacDonald et al.

(10) Patent No.: US 9,996,110 B2
(45) Date of Patent: Jun. 12, 2018

(54) DIRECT ATTACH DOCK COOLING LEVERAGING MAXIMUM SILICON JUNCTION TEMPERATURE CONTROL

(71) Applicant: Intel Corporation, Santa Clara, CA (US)

(72) Inventors: Mark A. MacDonald, Beaverton, OR (US); Yoshifumi Nishi, Ushiku (JP)

(73) Assignee: Intel Corporation, Santa Clara, CA (US)

( * ) Notice: Subject to any disclaimer, the term of this patent is extended or adjusted under 35 U.S.C. 154(b) by 227 days.

(21) Appl. No.: 14/583,045

(22) Filed: Dec. 24, 2014

(65) Prior Publication Data

US 2016/0187927 A1    Jun. 30, 2016

(51) Int. Cl.
G06F 1/16 (2006.01)
G06F 1/20 (2006.01)
H05K 7/20 (2006.01)

(52) U.S. Cl.
CPC ............ *G06F 1/1632* (2013.01); *G06F 1/203* (2013.01); *G06F 1/206* (2013.01); *H05K 7/20154* (2013.01)

(58) Field of Classification Search
CPC .... G06F 1/1632; G06F 1/206; G06F 1/20154; G06F 1/203; G06F 1/20; G06F 1/133385; H05K 7/20154; G02F 1/133385
USPC .......... 361/679.48, 694, 695, 679.41–679.46
See application file for complete search history.

(56) References Cited

U.S. PATENT DOCUMENTS

| | | | |
|---|---|---|---|
| 5,872,699 A | * | 2/1999 | Nishii .................. G06F 1/203 165/104.33 |
| 6,574,102 B2 | | 6/2003 | Usui et al. |
| 6,601,179 B1 | | 7/2003 | Jackson et al. |
| 6,691,197 B2 | | 2/2004 | Olson et al. |
| 7,668,958 B2 | | 2/2010 | Burr |
| 7,761,641 B2 | | 7/2010 | Mok et al. |
| 7,925,813 B2 | | 4/2011 | Mok et al. |
| 7,957,131 B1 | | 6/2011 | Mongia et al. |
| 8,267,158 B2 | * | 9/2012 | Zha .................. F04D 29/281 165/122 |

(Continued)

FOREIGN PATENT DOCUMENTS

WO     03/034664 A1    4/2003
WO    2004/112331 A1   12/2004

(Continued)

OTHER PUBLICATIONS

International Search Report and Written Opinion received for International Patent Application No. PCT/US2015/062552, dated Mar. 18, 2016, 11 pages.

(Continued)

*Primary Examiner* — Jerry Wu
*Assistant Examiner* — Stephen Sul
(74) *Attorney, Agent, or Firm* — Spectrum IP Law Group LLC (57) ABSTRACT

Methods and apparatus relating for direct attach dock cooling leveraging Maximum Silicon Junction Temperature (Tj) control are described. In an embodiment, performance of a mobile computing device is increased based at least in part on an indication that the mobile computing device is coupled to a dock. The dock includes a cooling fan proximate to a hotspot on a back skin of the mobile computing device. Other embodiments are also disclosed and claimed.

22 Claims, 9 Drawing Sheets

(56) References Cited

U.S. PATENT DOCUMENTS

| | | |
|---|---|---|
| 8,321,587 B2 | 11/2012 | Burr |
| 8,634,183 B2 | 1/2014 | Wikander et al. |
| 9,081,554 B2 | 7/2015 | MacDonald et al. |
| 2003/0045296 A1 | 3/2003 | Burr |
| 2003/0128510 A1* | 7/2003 | Anzai ................. G06F 1/18 361/679.48 |
| 2003/0159026 A1* | 8/2003 | Cupps ............... G06F 1/1626 713/1 |
| 2004/0253979 A1 | 12/2004 | Burr |
| 2005/0168191 A1* | 8/2005 | Lee .................... G06F 1/1632 320/114 |
| 2006/0056151 A1* | 3/2006 | Hara ................ H05K 7/20145 361/696 |
| 2007/0091560 A1* | 4/2007 | Parker ............... G06F 1/1632 361/679.48 |
| 2007/0139888 A1* | 6/2007 | Hamman ............ F28F 9/0282 361/701 |
| 2008/0150122 A1 | 6/2008 | Lee et al. |
| 2009/0322472 A1 | 12/2009 | MacDonald et al. |
| 2009/0323275 A1 | 12/2009 | Rehmann et al. |
| 2012/0249218 A1* | 10/2012 | Shoemaker ........... G01K 3/08 327/512 |
| 2013/0114203 A1 | 5/2013 | Ignatchenko et al. |
| 2014/0092561 A1* | 4/2014 | Chen .................. G06F 1/181 361/720 |
| 2014/0098486 A1* | 4/2014 | Davis ................. G06F 1/1607 361/679.41 |
| 2014/0160668 A1 | 6/2014 | Heymann et al. |
| 2014/0331069 A1* | 11/2014 | Branover ............ G06F 1/206 713/340 |
| 2014/0354570 A1* | 12/2014 | Makinen .............. G06F 3/041 345/173 |
| 2015/0342023 A1* | 11/2015 | Refai-Ahmed ...... H05K 1/0203 361/696 |
| 2016/0179147 A1 | 6/2016 | Burr et al. |
| 2016/0363970 A1* | 12/2016 | Zhou ..................... G06F 1/20 |

FOREIGN PATENT DOCUMENTS

| | | |
|---|---|---|
| WO | 2012/087765 A2 | 6/2012 |
| WO | 2016/105813 A1 | 6/2016 |

OTHER PUBLICATIONS

International Search Report and Written Opinion received for International Application No. PCT/US2015/062283, dated Mar. 4, 2016, 15 pages.

International Preliminary Report on Patentability received for International Application No. PCT/US2015/062552, dated Jul. 6, 2017, 8 pages.

* cited by examiner

DIRECT ATTACH DOCK COOLING LEVERAGING MAXIMUM SILICON JUNCTION TEMPERATURE CONTROL

FIELD

The present disclosure generally relates to the field of electronics. More particularly, an embodiment relates to techniques for direct attach dock cooling leveraging Maximum Silicon Junction Temperature (Tj) control.

BACKGROUND

Portable computing devices are gaining popularity, in part, because of their decreasing prices and increasing performance. However, as their performance capabilities are improved, the need to reduce the operating temperature of portable computing devices becomes increasingly important, for example, to utilize their improved performance (at all or) for a longer duration or more generally their usability.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

As discussed above, with improving performance capabilities of portable computing devices, the need to reduce their operating temperature becomes increasingly important, for example, to utilize their improved performance (at all or) for a longer duration or more generally their usability. Moreover, some portable computing devices (such as a tablet, a smartphone, a phablet (named so to indicate that the device straddles between a traditional smartphone and a tablet, e.g., generally having a larger display than a traditional smartphone), etc.) may be coupled to a docking station or dock to provide additional functionality. The additional functionality may include charging, additional interfaces (e.g., for external devices such as monitors, hard drives, etc.), etc.

Some embodiments provide techniques for direct attach dock cooling leveraging Maximum Silicon Junction Temperature (Tj) control. As discussed herein, Tj control generally refers to the ability to dynamically control Tj or the maximum die/junction temperature. In one embodiment, a portable (also referred to herein interchangeably as "mobile") computing device includes a Central Processing Unit (CPU) and/or an SOC (System On Chip) such as the SOC of FIG. 8 and the SOC is directly (e.g., thermally) coupled/mounted to the back cover of the device. However, embodiments are not limited to cooling SOC components and may be applied to any heat generating component of a computing device, as further discussed herein. The direct attach cooling configuration allows the SOC (or another heat generating component such as a processor) to be operated at dramatically increased power (e.g., higher frequency and/or voltage levels) while docked. The increased power in turn improves the performance level and/or speed of the portable computing device when docked (e.g., allowing the device to be used for example as a desktop/workstation computer replacement), while still allowing the device to be used in a handheld mode (albeit with relatively lower performance levels, e.g., in a fanless mode).

Hence, control Tj may be used contextually to allow for different limits in different use cases (such as docked vs. undocked). In an embodiment, "Control Tj" refers to a software mechanism for dynamically adjusting the maximum Tj value. Accordingly, some embodiments may use a combination of a direct chassis attach for higher power components of a portable computing device (including for example a compute element such as a processor core discussed with reference to FIGS. 5-8 and/or an integrated circuit die or package such as an SOC) with aggressive thermal management in the passive use case and aggressive direct convection cooling on one or more hotspots in the docked case. The additional cooling capability may increase cooling by about 3 to 4 times the passive cooling limit in some embodiments.

Figure 1:
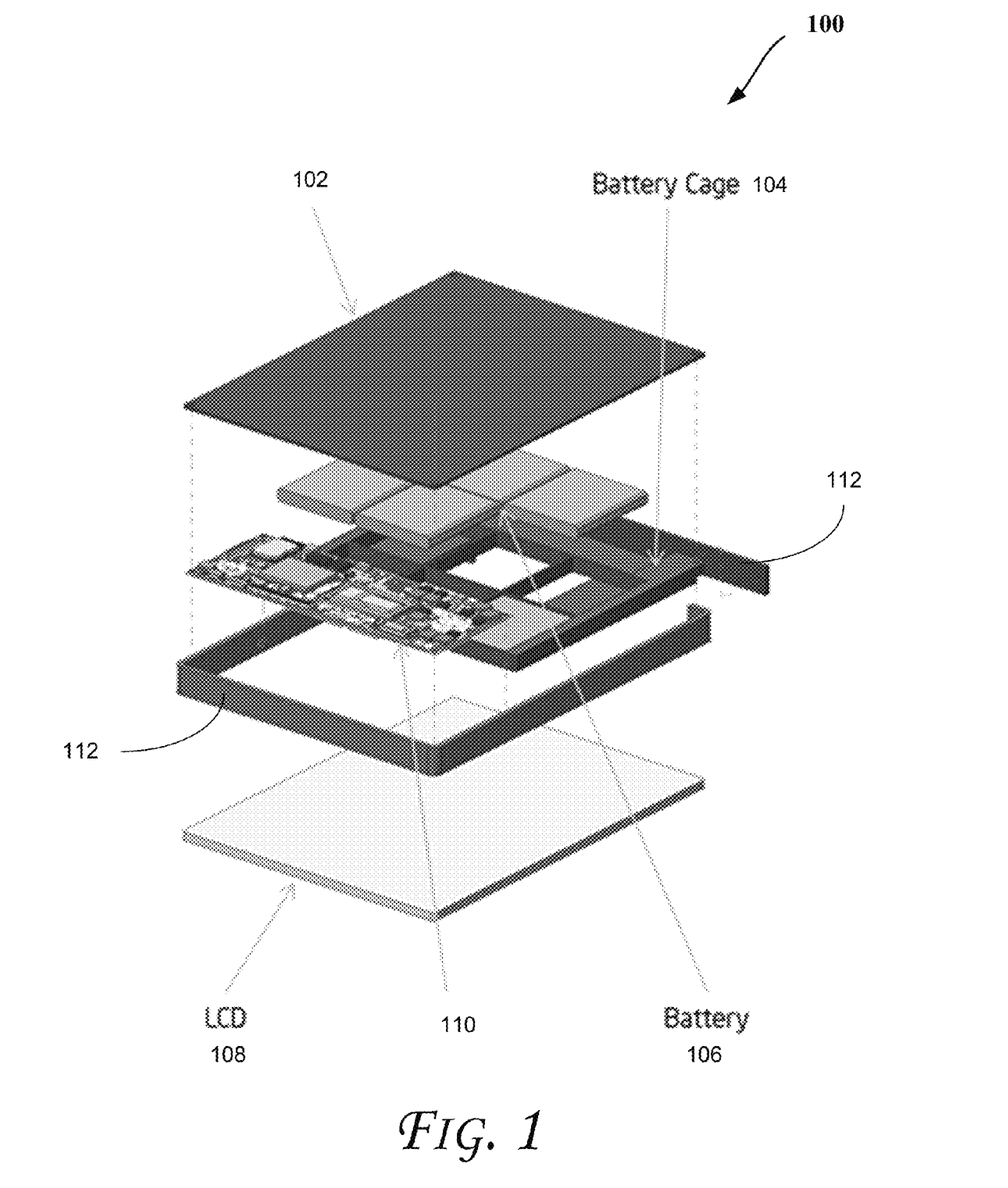
FIG. 1 illustrates an exploded view of a mobile computing device with a heat generating component bonded directly to a back skin, according to an embodiment.

FIG. 1 illustrates an exploded view of a portable computing device 100 with a heat generating component (such as an SOC) bonded directly to a back skin, according to an embodiment. The back cover 102 of the device may include a relatively thick (e.g., about 2-4 mm) high conductivity material such as copper, aluminum, magnesium, steel (e.g., polished or stainless), their alloys, as well as thermally conductive plastics, ceramics, graphite, or composites, etc. Normally, such a design would lead to a severe ergonomic hotspot problem on the chassis surface at the location of the attach, but in one embodiment Tj may be controlled (e.g., in compliance with an aspect of the DPTF (Dynamic Platform and Thermal Framework) or other comparable thermal management scheme) to limit the component or SOC temperature to a value that avoids or at least reduces the hotspot issues (e.g., in the low 40s or high 30s Celsius). This will limit the resultant hotspot(s) to within ergonomic limits when the device is in handheld mode. Because of the large high conductivity spreader formed by the rear chassis, the passive cooling limit for the system is expected to be comparable to traditional designs. This approach may add a modest amount of weight and a minor cost increase due to the use of a larger amount of high conductivity material (and/or heat pipe(s)/vapor chamber(s)), but these issues may be readily justifiable in view of the fact that the same device may be used as both a handheld device and a high performance desktop/workstation mode (and also because some high conductivity materials are light (e.g., graphite) and some are cheap (e.g., aluminum)).

As illustrated in FIG. 1, device 100 also includes a battery cage 104 (e.g., to house a battery pack 106), a display device 108 or Liquid Crystal Display (LCD) (such as discussed with reference to the display device 650 of FIG. 6), a printed circuit board 110 (which may include various components such as those discussed with reference to FIGS. 5-8, including, for example, an SOC, memory, storage device, wireless interface, etc.), and an enclosure or case 112.

When device 100 is docked, the device power consumption is allowed to increase dramatically and provide forced air cooling directly on the back chassis wall 102 using an impingement flow or radial/dish fan in close proximity to the hotspot(s), as will be further discussed with reference to FIGS. 2A-4B. The fan or flow will originate from an active cooling dock device. The high thermal conductivity connection between the heat generation device components and the back skin 102 provides a low thermal resistance path, allowing for significant cooling in this configuration.

Moreover, in some external cooling solutions, the primary design emphasis may be to increase the available surface area for heat transfer and expose the surface area to external flow. Such approaches may include flow over fin-shaped device surface and direct coupling of the device surface to additional fins in the dock. By contrast, some embodiments provide a cooling solution with the realization that the available surface area is limited and instead focusing on enhancing the heat flux itself. In order to achieve this, one embodiment utilizes a design in which high power processor (and/or other power generating component of a mobile computing device) is directly (thermally) coupled to the high conductivity back cover 102. Further, while such direct attachment technique may be used for lower power processors, it is generally considered a bad practice for today's higher power processors as this develops localized hot spot on the device surface. To this end, an embodiment turns the hotspot problem into an advantage by focusing on improving the local heat flux in the hotspot area.

In order to generate the maximum possible heat transfer coefficient over the hotspot region(s), a direct fan exposure is used in an embodiment. For a cooling fan rotor, the highest air velocity can generally be seen at the vicinity of the blades. The velocity and especially the shear rates become damped very quickly as the air leaves the blades and the resulting average velocity becomes significantly lower. And, since convective heat transfer is a function of air velocity (or more specifically, the aerodynamic shear rate), the opportunity in heat transfer coefficient is increasingly decreased as we move away from the fan blade tips.

Figure 2A:
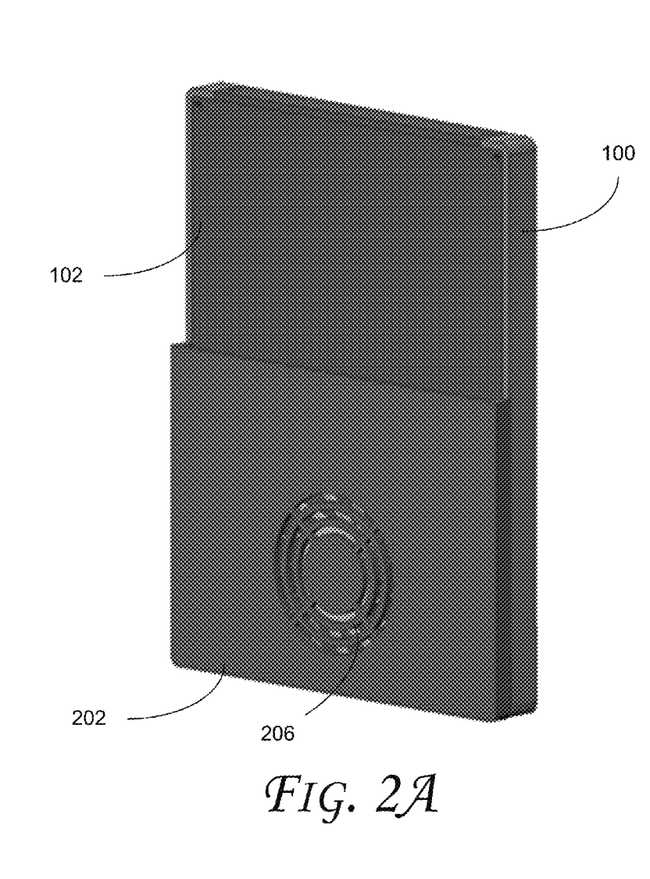
FIGS. 2A and 2B illustrate perspective views of a docked mobile computing device, according to some embodiments.
Figure 2B:
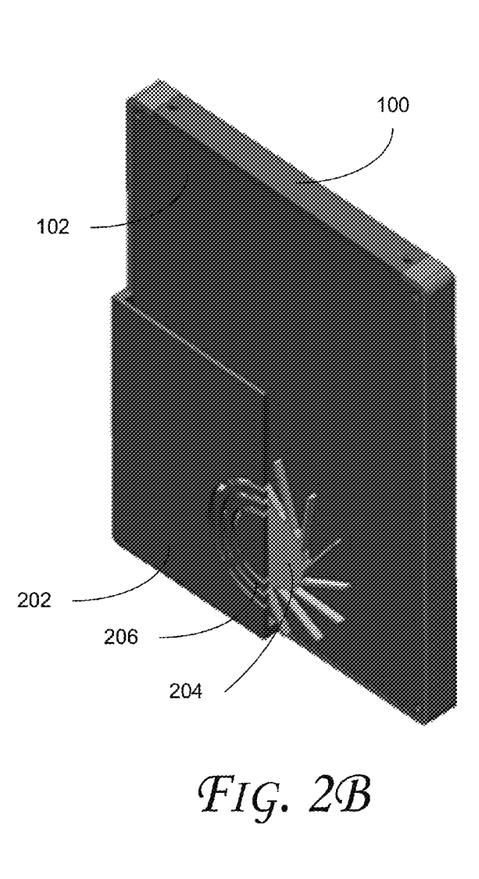

FIGS. 2A and 2B illustrate perspective views of a docked portable computing device, according to some embodiments. As shown in FIGS. 2A and 2B, when device 100 is attached or inserted into a dock 202, device 100 is provided with direct cooling from a (e.g., dish) fan 204 to back skin 102.

Referring to FIGS. 2A and 2B, dock 202 includes exhaust apertures 206 to facilitate air flow away from the back skin 102 as fan 204 rotates. In accordance with some embodiments, these figures present a cooling geometry to utilize the localized high velocity in the vicinity of fan blades. In this design, the rotor sits extremely close to the surface of the device 100, subjecting the device to the highest velocity shear possible. One advantages of this design can be seen in a comparison of the heat transfer coefficient.

Figure 2C:
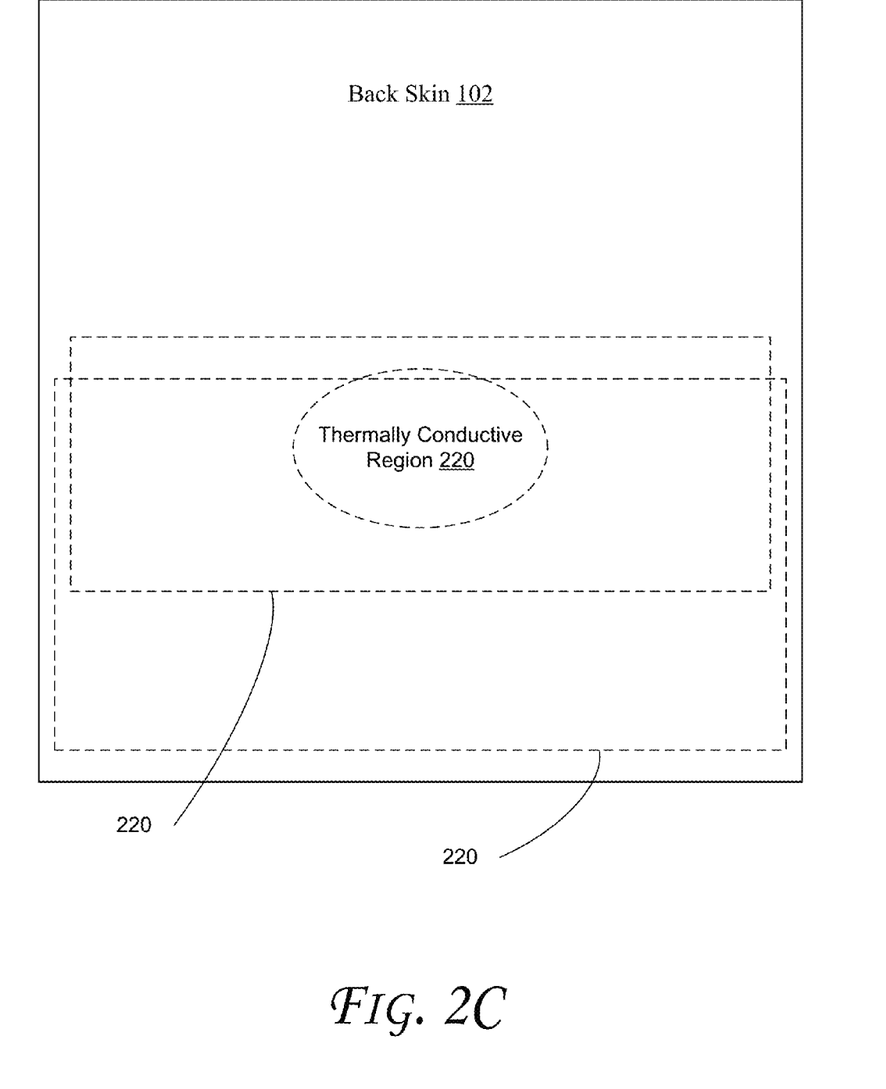
FIG. 2C shows a top view of the back skin of a mobile computing device, according to an embodiment.

FIG. 2C shows a top view of the back skin of a mobile computing device, according to an embodiment. FIG. 2C shows sample regions of material on the back skin/cover 102. More specifically, one or more regions 220 (which may have various shapes and coverage on the back skin 102) may be constructed with thermally conductive material (such as those discussed with reference to FIGS. 1-2B). As shown, one or more regions 220 may be provided on the back skin 102. In one embodiment, region(s) 220 are provided proximate (or thermally connected or coupled) to the hot spot(s) and/or cooling fan(s) discussed herein with reference to other figures. Further, regions 220 may overlap in some embodiments.

Figure 3A:
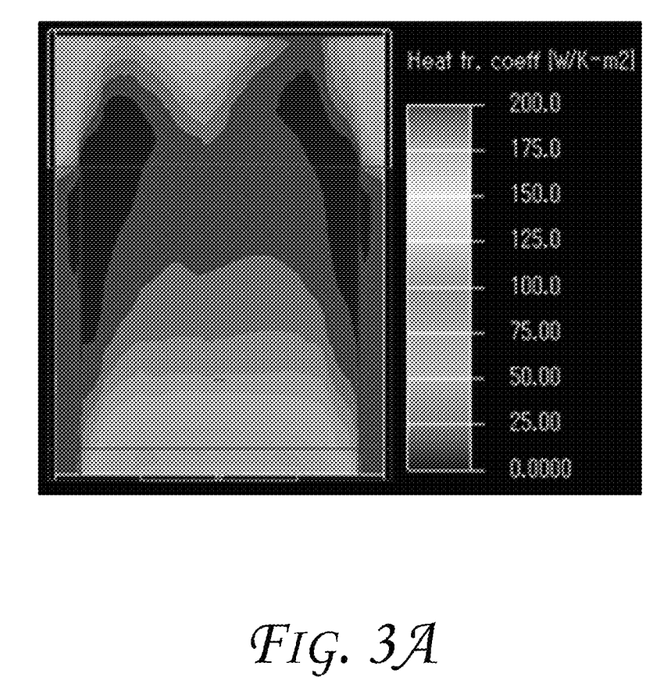
FIGS. 3A and 3B show sample heat transfer coefficient values, according to some embodiments.
Figure 3B:
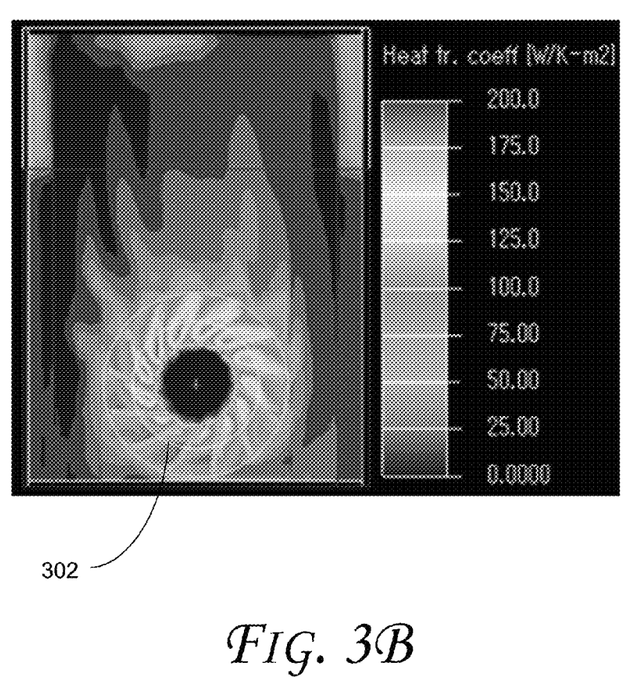

FIGS. 3A and 3B, respectively, show sample heat transfer coefficient values (in $W/K-m^2$ or Watts/Kelvin over $m^2$) for conventional external cooling versus an embodiment, e.g., based on simulations. FIG. 3B clearly shows significantly higher heat transfer coefficient region that is following the location of the rotor blades 302. It is also important to note that these simulations do not accurately capture the full detail of the near-field flow interaction between the blades and the surface of the back skin. Experimental data however suggest that local heat transfer coefficients on the order of 500-1000 $W/K-m^2$ may be achieved with this geometry. Another advantage of this design is that it is inherently thin and can even be adopted in mobile external cooling solution, allowing the device to dissipate full power.

Figure 4A:
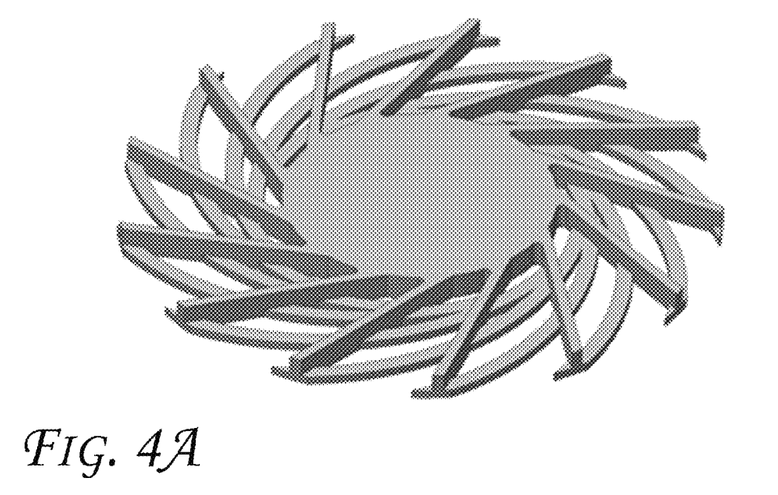
FIGS. 4A and 4B illustrate cooling fan designs, according to some embodiments.
Figure 4B:
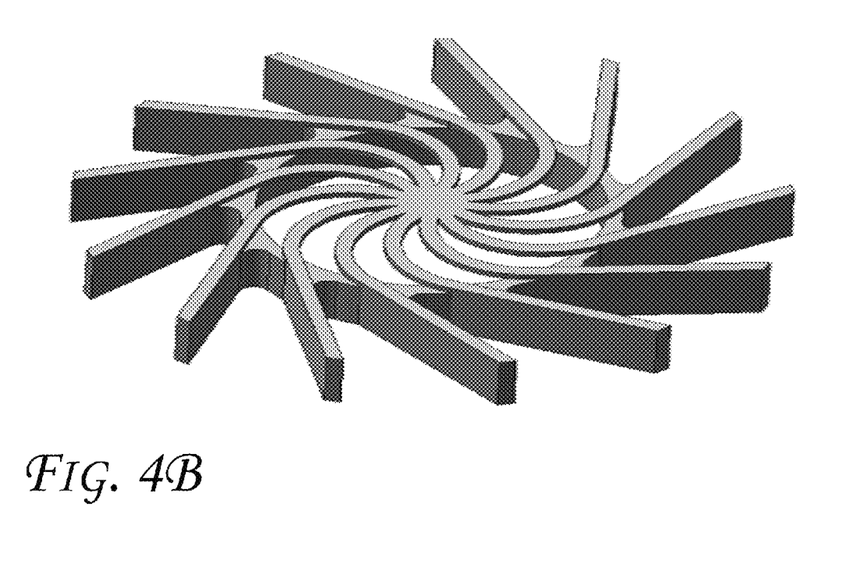

FIGS. 4A and 4B illustrate cooling fan designs, according to some embodiments. These modified fan blade geometries are envisioned to increase localized heat transfer effects and provide local shear rate enhancements.

Referring to FIG. 4B, 15-20% more fin edges are provided relative to FIG. 4A (since the fan blades shown in FIG. 4B extend to the center. This may provide a less choppy air flow to provide more efficient cooling. Also, the blades shown in FIGS. 4A and 4B may be flush mounted (or otherwise immediately adjacent and/or parallel) to back skin 102 of FIGS. 1 and 2A-2B, e.g., to allow for a heat transfer effect that is more perpendicular to the surface 102 and not just pulling away heat.

Accordingly, some embodiments enable the industry to use adaptive performance, scalability, and/or composable computing. Moreover, embodiments provide specific approaches that enhance cooling of this combination. For example, these embodiments may provide a very wide dynamic range for adaptive performance, with a nominal 2 W SOC limit in handheld mode and about 10 W SOC limit when docked, which can fully utilize the scalability of the upcoming and future high performance SOC-based devices.

Figure 5:
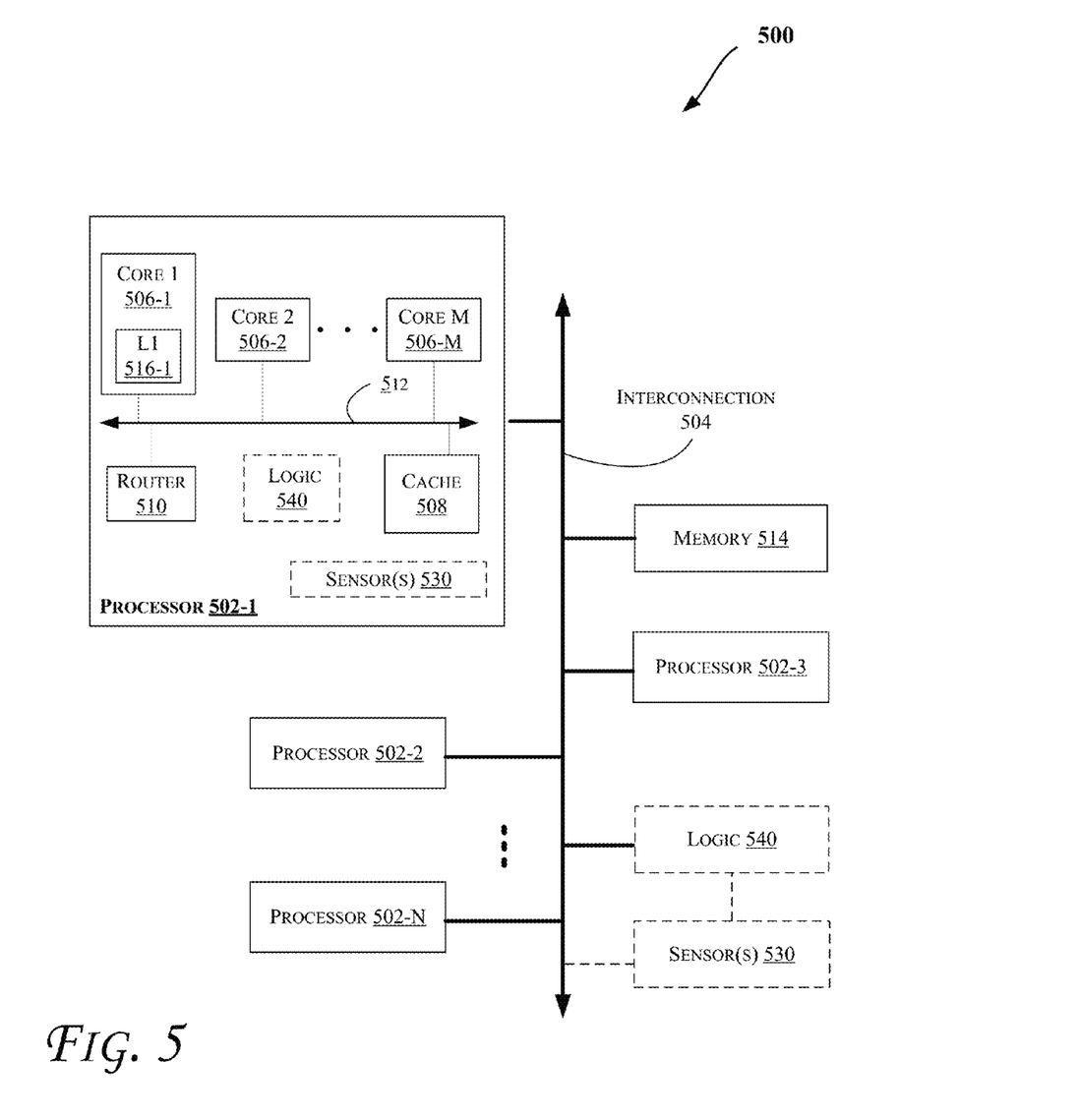
FIGS. 5-8 illustrate block diagrams of embodiments of computing systems, which may be utilized to implement various embodiments discussed herein.

Some embodiments may be applied in computing systems that include one or more processors (e.g., with one or more processor cores), such as those discussed with reference to FIGS. 5-8, including for example mobile computing devices such as a smartphone, tablet, UMPC (Ultra-Mobile Personal Computer), laptop computer, Ultrabook™ computing device, wearable devices (such as smart watch, smart glasses, smart bracelets, and the like), etc. More particularly, FIG. 5 illustrates a block diagram of a computing system 500, according to an embodiment. The system 500 may include one or more processors 502-1 through 502-N (generally referred to herein as "processors 502" or "processor 502").

The processors 502 may be general-purpose CPUs (Central Processing Units) and/or GPUs (Graphics Processing Units) in various embodiments. The processors 502 may communicate via an interconnection or bus 504. Each processor may include various components some of which are only discussed with reference to processor 502-1 for clarity. Accordingly, each of the remaining processors 502-2 through 502-N may include the same or similar components discussed with reference to the processor 502-1.

In an embodiment, the processor 502-1 may include one or more processor cores 506-1 through 506-M (referred to herein as "cores 506," or "core 506"), a cache 508, and/or a router 510. The processor cores 506 may be implemented on a single integrated circuit (IC) chip. Moreover, the chip may include one or more shared and/or private caches (such as cache 508), buses or interconnections (such as a bus or interconnection 512), graphics and/or memory controllers (such as those discussed with reference to FIGS. 6-8), or other components.

In one embodiment, the router 510 may be used to communicate between various components of the processor 502-1 and/or system 500. Moreover, the processor 502-1 may include more than one router 510. Furthermore, the multitude of routers 510 may be in communication to enable data routing between various components inside or outside of the processor 502-1.

The cache 508 may store data (e.g., including instructions) that are utilized by one or more components of the processor 502-1, such as the cores 506. For example, the cache 508 may locally cache data stored in a memory 514 for faster access by the components of the processor 502 (e.g., faster access by cores 506). As shown in FIG. 5, the memory 514 may communicate with the processors 502 via the interconnection 504. In an embodiment, the cache 508 (that may be shared) may be a mid-level cache (MLC), a last level cache (LLC), etc. Also, each of the cores 506 may include a Level 1 (L1) cache (516-1) (generally referred to herein as "L1 cache 516") or other levels of cache such as a Level 2 (L2) cache. Moreover, various components of the processor 502-1 may communicate with the cache 508 directly, through a bus (e.g., the bus 512), and/or a memory controller or hub.

As shown, system 500 may also include one or more sensors 530 to facilitate thermal and/or performance management as discussed herein. For example, sensor(s) 530 may be provided proximate to components of system 500, including, for example, the cores 506, interconnections 504 or 512, components outside of the processor 502 (like a voltage regulator and/or power source (not shown)), etc., to sense variations in various factors effecting power/thermal behavior of the system/platform, such as temperature, operating frequency, operating voltage, power consumption, and/or inter-core communication activity, etc. In an embodiment, at least one sensor 530 may be coupled to a dock to detect when the mobile computing device 100 is docked or otherwise attached to dock 202 of FIGS. 2A-2B. System 500 also includes logic 540 to control thermal behavior and/or performance of (e.g., heat generating) components of system 500 (such as processors 502, memory 514, etc.) and cause an adjustment or modification to the thermal behavior and/or performance of such components, e.g., based on information received from the sensor(s) 530.

While some optional locations of logic 540 and sensors 530 are shown in FIGS. 5-8, these locations are for illustrative purposes only and items 530/540 may be located elsewhere in these computing systems and embodiments are not limited to the locations shown in these figures. For example, in an embodiment, one or more sensors 530 may be located physically/thermally proximate to the back skin 102 (and/or proximate to hot spot(s)) discussed with reference to the previous figures.

Figure 6:
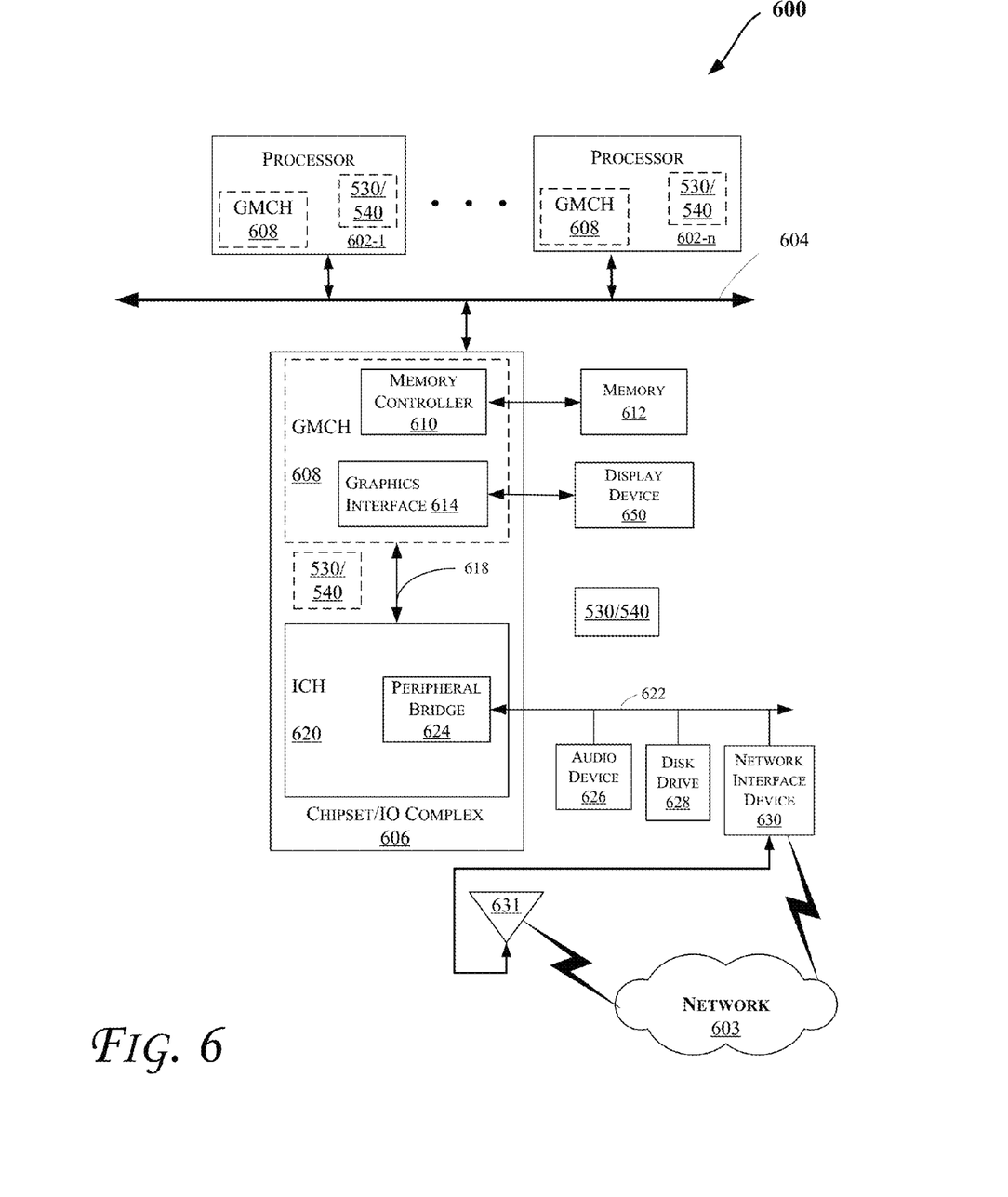

FIG. 6 illustrates a block diagram of a computing system 600 in accordance with an embodiment. The computing system 600 may include one or more Central Processing Units (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)).

Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 502 of FIG. 5. Further, one or more components of system 600 may include logic 540 coupled to the sensor(s) 530, discussed with reference to FIGS. 1-5 (including but not limited to those locations illustrated in FIG. 6). Also, the operations discussed with reference to FIGS. 1-5 may be performed by one or more components of the system 600.

A chipset 606 may also communicate with the interconnection network 604. The chipset 606 may include a graphics memory control hub (GMCH) 608, which may be located in various components of system 600 (such as those shown in FIG. 6). The GMCH 608 may include a memory controller 610 that communicates with a memory 612 (which may be the same or similar to the memory 514 of FIG. 5). The memory 612 may store data, including sequences of instructions, that may be executed by the CPU 602, or any other device included in the computing system 600. In one embodiment, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The GMCH 608 may also include a graphics interface 614 that communicates with a display device 650. In one embodiment, the graphics interface 614 may communicate with the display device via an accelerated graphics port (AGP) or Peripheral Component Interconnect (PCI) (or PCI express (PCIe) interface). In an embodiment, the display (such as a flat panel display or LCD) may communicate with the graphics interface 614 through, for example, a signal converter that translates a digital representation of an image stored in a storage device such as video memory or system memory into display signals that are interpreted and displayed by the display device. The display signals produced by the display device may pass through various control devices before being interpreted by and subsequently displayed on the display device.

A hub interface 618 may allow the GMCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB)

controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. As shown, the network interface device 630 may be coupled to an antenna 631 to wirelessly (e.g., via an Institute of Electrical and Electronics Engineers (IEEE) 802.11 interface (including IEEE 802.11a/b/g/n/ac, etc.), cellular interface, 3G, 5G, LPE, etc.) communicate with the network 603. Other devices may communicate via the bus 622. Also, various components (such as the network interface device 630) may communicate with the GMCH 608. In addition, the processor 602 and the GMCH 608 may be combined to form a single chip. Furthermore, a graphics accelerator may be included within the GMCH 608 in other embodiments.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
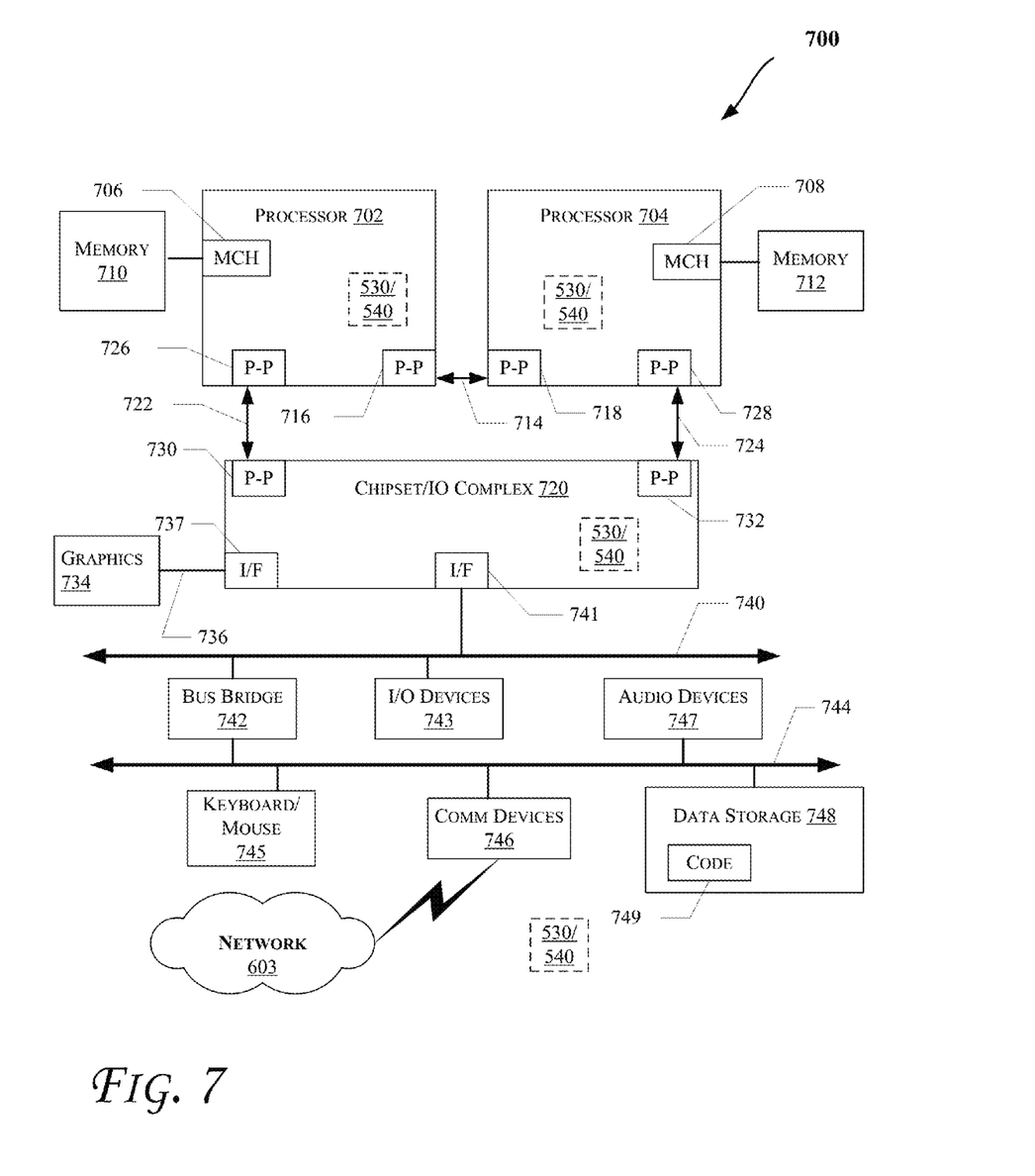

FIG. 7 illustrates a computing system 700 that is arranged in a point-to-point (PtP) configuration, according to an embodiment. In particular, FIG. 7 shows a system where processors, memory, and input/output devices are interconnected by a number of point-to-point interfaces. The operations discussed with reference to FIGS. 1-6 may be performed by one or more components of the system 700.

As illustrated in FIG. 7, the system 700 may include several processors, of which only two, processors 702 and 704 are shown for clarity. The processors 702 and 704 may each include a local memory controller hub (MCH) 706 and 708 to enable communication with memories 710 and 712. The memories 710 and/or 712 may store various data such as those discussed with reference to the memory 612 of FIG. 6.

In an embodiment, the processors 702 and 704 may be one of the processors 602 discussed with reference to FIG. 6. The processors 702 and 704 may exchange data via a point-to-point (PtP) interface 714 using PtP interface circuits 716 and 718, respectively. Also, the processors 702 and 704 may each exchange data with a chipset 720 via individual PtP interfaces 722 and 724 using point-to-point interface circuits 726, 728, 730, and 732. The chipset 720 may further exchange data with a graphics circuit 734 via a graphics interface 736, e.g., using a PtP interface circuit 737.

At least one embodiment may be provided within the processors 702 and 704. Further, one or more components of system 700 may include logic 540 coupled to the sensor(s) 530, discussed with reference to FIGS. 1-6 (including but not limited to those locations illustrated in FIG. 7). Other embodiments, however, may exist in other circuits, logic units, or devices within the system 700 of FIG. 7. Furthermore, other embodiments may be distributed throughout several circuits, logic units, or devices illustrated in FIG. 7.

The chipset 720 may communicate with a bus 740 using a PtP interface circuit 741. The bus 740 may communicate with one or more devices, such as a bus bridge 742 and I/O devices 743. Via a bus 744, the bus bridge 742 may communicate with other devices such as a keyboard/mouse 745, communication devices 746 (such as modems, network interface devices, or other communication devices that may communicate with the computer network 603), audio I/O device 747, and/or a data storage device 748. The data storage device 748 may store code 749 that may be executed by the processors 702 and/or 704.

Figure 8:
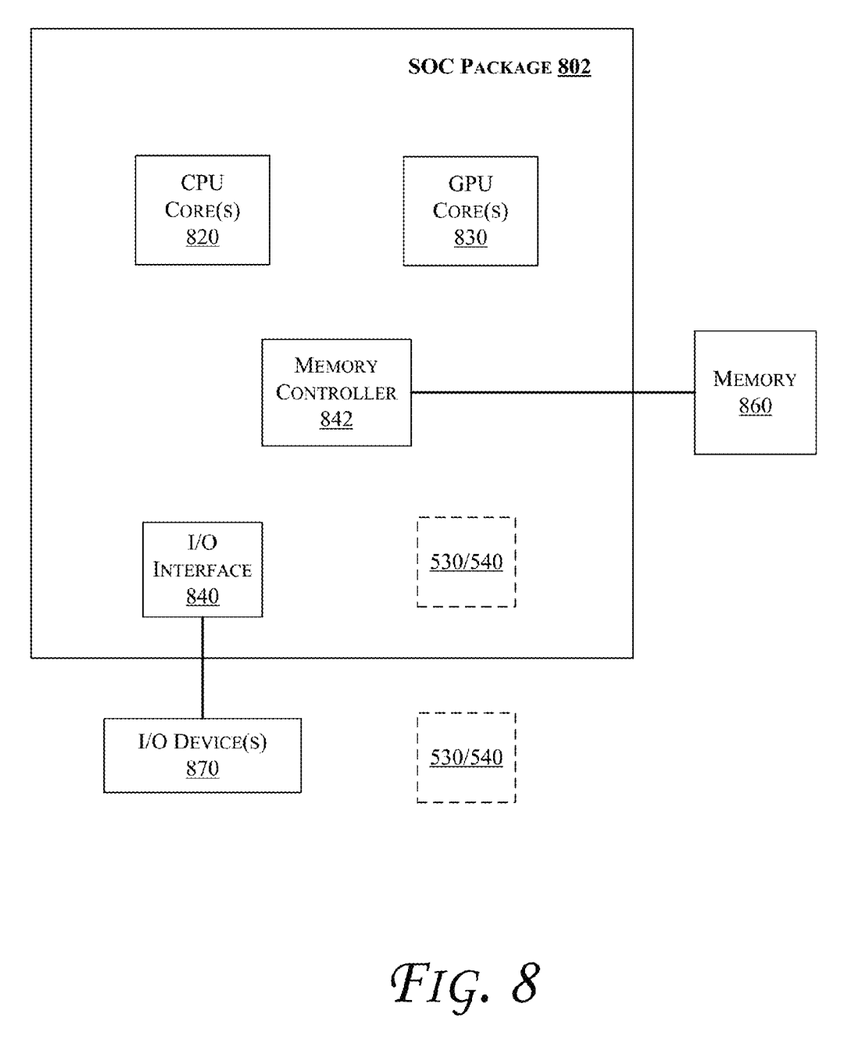

In some embodiments, one or more of the components discussed herein can be embodied as a System On Chip (SOC) device. FIG. 8 illustrates a block diagram of an SOC package in accordance with an embodiment. As illustrated in FIG. 8, SOC 802 includes one or more Central Processing Unit (CPU) cores 820, one or more Graphics Processing Unit (GPU) cores 830, an Input/Output (I/O) interface 840, and a memory controller 842. Various components of the SOC package 802 may be coupled to an interconnect or bus such as discussed herein with reference to the other figures. Also, the SOC package 802 may include more or less components, such as those discussed herein with reference to the other figures. Further, each component of the SOC package 820 may include one or more other components, e.g., as discussed with reference to the other figures herein. In one embodiment, SOC package 802 (and its components) is provided on one or more Integrated Circuit (IC) die, e.g., which are packaged into a single semiconductor device.

As illustrated in FIG. 8, SOC package 802 is coupled to a memory 860 (which may be similar to or the same as memory discussed herein with reference to the other figures) via the memory controller 842. In an embodiment, the memory 860 (or a portion of it) can be integrated on the SOC package 802.

The I/O interface 840 may be coupled to one or more I/O devices 870, e.g., via an interconnect and/or bus such as discussed herein with reference to other figures. I/O device(s) 870 may include one or more of a keyboard, a mouse, a touchpad, a display device (such as the display devices 108 and/or 650), an image/video capture device (such as a camera or camcorder/video recorder), a touch screen, a speaker, or the like. Furthermore, SOC package 802 may include/integrate logic 540 and/or sensor(s) 530 in some embodiments. Alternatively, logic 540 and/or sensor(s) 530 may be provided outside of the SOC package 802 (i.e., logic 540 is provided as a discrete logic). Also, in an embodiment, one or more of the sensors 530 may be (thermally) coupled to the back skin 102 and/or proximate to the one or more hotspots discussed with reference to the previous figures.

Moreover, the scenes, images, or frames discussed herein (e.g., which may be processed by the graphics logic in various embodiments) may be captured by an image capture device (such as a digital camera (that may be embedded in another device such as a smart phone, a tablet, a laptop, a stand-alone camera, etc.) or an analog device whose captured images are subsequently converted to digital form). Moreover, the image capture device may be capable of capturing multiple frames in an embodiment. Further, one or more of the frames in the scene are designed/generated on a computer in some embodiments. Also, one or more of the frames of the scene may be presented via a display (such as the display discussed with reference to FIGS. 6-8, including for example a flat panel display device or LCD, etc.).

The following examples pertain to further embodiments. Example 1 includes an apparatus comprising: logic, the logic at least partially comprising hardware logic, to cause an increase in performance of a mobile computing device based at least in part on an indication that the mobile computing device is coupled to a dock, wherein the dock is to comprise a cooling fan proximate to a hotspot on a back skin of the mobile computing device. Example 2 includes the apparatus of example 1, wherein the back skin of the mobile computing device is to comprise at least partially a material selected from a list comprising: copper, aluminum, magnesium, steel, and their alloys. Example 3 includes the apparatus of example 1, wherein the back skin of the mobile computing device is to comprise at least partially a material selected from a list comprising thermally conductive: plastic, ceramic, graphite, or composites. Example 4 includes the apparatus of example 1, wherein the cooling fan is to be physically adjacent to the hotspot on the back skin of the mobile computing device. Example 5 includes the apparatus of example 1, wherein the cooling fan is to be thermally coupled or connected to the hotspot on the back skin of the mobile computing device. Example 6 includes the apparatus of example 1, wherein one or more heat generating components of the mobile computing device are to generate the hotspot. Example 7 includes the apparatus of example 6, wherein the one or more heat generating components of the mobile computing device are to comprise one or more of: a System On Chip (SOC) device; a processor, having one or more processor cores; and memory. Example 8 includes the apparatus of example 1, wherein the logic is to cause the increase in performance of the mobile computing device based at least in part on a value to be detected by a sensor. Example 9 includes the apparatus of example 1, wherein the cooling fan is to comprise a plurality of fan blades that are to extend to a center of the cooling fan. Example 10 includes the apparatus of example 1, wherein the cooling fan is to comprise a plurality of fan blades that are to be immediately adjacent or parallel to the back skin of the mobile computing device. Example 11 includes the apparatus of example 1, comprising logic to dynamically control maximum junction temperature of one or more components of the mobile computing device. Example 12 includes the apparatus of example 1, further one or more sensors to detect attachment of the mobile computing device to the dock. Example 13 includes the apparatus of example 1, wherein the mobile computing device is to comprise one of: a smartphone, a tablet, a phablet, a UMPC (Ultra-Mobile Personal Computer), a laptop computer, an Ultrabook™ computing device, and a wearable device. Example 14 includes the apparatus of example 1, wherein one or more heat generating components of the mobile computing device are directly connected to the back skin. Example 15 includes the apparatus of example 1, wherein one or more of the logic, a processor having one or more processor cores, one or more sensors, and memory are on a single integrated circuit die.

Example 16 includes a method comprising: causing an increase in performance of a mobile computing device based at least in part on an indication that the mobile computing device is coupled to a dock, wherein the dock is to comprise a cooling fan proximate to a hotspot on a back skin of the mobile computing device. Example 17 includes the method of example 16, wherein the cooling fan is physically adjacent to the hotspot on the back skin of the mobile computing device. Example 18 includes the method of example 16, wherein the cooling fan is thermally coupled or connected to the hotspot on the back skin of the mobile computing device. Example 19 includes the method of example 16, wherein one or more heat generating components of the mobile computing device generate the hotspot. Example 20 includes the method of example 19, wherein the one or more heat generating components of the mobile computing device comprise one or more of: a System On Chip (SOC) device; a processor, having one or more processor cores; and memory. Example 21 includes the method of example 16, wherein the mobile computing device comprises one of: a smartphone, a tablet, a phablet, a UMPC (Ultra-Mobile Personal Computer), a laptop computer, an Ultrabook™ computing device, and a wearable device.

Example 22 includes a system comprising: a mobile computing device coupled to a display device to display one or more images; and logic, the logic at least partially comprising hardware logic, to cause an increase in performance of the mobile computing device based at least in part on an indication that the mobile computing device is coupled to a dock, wherein the dock is to comprise a cooling fan proximate to a hotspot on a back skin of the mobile computing device. Example 23 includes the system of example 22, wherein the cooling fan is to be physically adjacent to the hotspot on the back skin of the mobile computing device. Example 24 includes the system of example 22, wherein the cooling fan is to be thermally coupled or connected to the hotspot on the back skin of the mobile computing device. Example 25 includes the system of example 22, wherein one or more heat generating components of the mobile computing device are to generate the hotspot. Example 26 includes the system of example 25, wherein the one or more heat generating components of the mobile computing device are to comprise one or more of: a System On Chip (SOC) device; a processor, having one or more processor cores; and memory.

Example 27 includes an apparatus comprising means to perform a method as set forth in any preceding example.

Example 28 comprises machine-readable storage including machine-readable instructions, when executed, to implement a method or realize an apparatus as set forth in any preceding example.

In various embodiments, the operations discussed herein, e.g., with reference to FIGS. 1-8, may be implemented as hardware (e.g., logic circuitry), software, firmware, or combinations thereof, which may be provided as a computer program product, e.g., including a tangible (e.g., non-transitory) machine-readable or computer-readable medium having stored thereon instructions (or software procedures) used to program a computer to perform a process discussed herein. The machine-readable medium may include a storage device such as those discussed with respect to FIGS. 1-8.

Additionally, such computer-readable media may be downloaded as a computer program product, wherein the program may be transferred from a remote computer (e.g., a server) to a requesting computer (e.g., a client) by way of data signals provided in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used.

In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
logic, the logic at least partially comprising hardware logic, to cause an increase in performance of a mobile computing device based at least in part on an indication that the mobile computing device is coupled to a dock, wherein the dock is to comprise a cooling fan proximate to a hotspot on a back skin of the mobile computing device, wherein the cooling fan is to comprise a plurality of fan blades, wherein the plurality of fan blades are to comprise a plurality of straight blades and a plurality of curved blades, wherein a first straight blade of the plurality of straight blades is to overlap at least two curved blades of the plurality of curved blades.

2. The apparatus of claim 1, wherein the back skin of the mobile computing device is to comprise at least partially a material selected from a list comprising: copper, aluminum, magnesium, steel, and their alloys.

3. The apparatus of claim 1, wherein the back skin of the mobile computing device is to comprise at least partially a material selected from a list comprising thermally conductive: plastic, ceramic, graphite, or composites.

4. The apparatus of claim 1, wherein the cooling fan is to be physically adjacent to the hotspot on the back skin of the mobile computing device.

5. The apparatus of claim 1, wherein the cooling fan is to be thermally coupled or connected to the hotspot on the back skin of the mobile computing device.

6. The apparatus of claim 1, wherein one or more heat generating components of the mobile computing device are to generate the hotspot, wherein the one or more heat generating components of the mobile computing device are to comprise one or more of: a System On Chip (SOC) device; a processor, having one or more processor cores; and memory.

7. The apparatus of claim 1, wherein the logic is to cause the increase in performance of the mobile computing device based at least in part on a value to be detected by a sensor.

8. The apparatus of claim 1, wherein the plurality of fan blades are to extend to a center of the cooling fan.

9. The apparatus of claim 1, wherein the plurality of fan blades are to be immediately adjacent or parallel to the back skin of the mobile computing device.

10. The apparatus of claim 1, comprising logic to dynamically control maximum junction temperature of one or more components of the mobile computing device.

11. The apparatus of claim 1, further one or more sensors to detect attachment of the mobile computing device to the dock.

12. The apparatus of claim 1, wherein the mobile computing device is to comprise one of: a smartphone, a tablet, a phablet, a UMPC (Ultra-Mobile Personal Computer), a laptop computer, an Ultrabook™ computing device, and a wearable device.

13. The apparatus of claim 1, wherein one or more heat generating components of the mobile computing device are directly connected to the back skin.

14. The apparatus of claim 1, wherein one or more of the logic, a processor having one or more processor cores, one or more sensors, and memory are on a single integrated circuit die.

15. A method comprising:
causing an increase in performance of a mobile computing device based at least in part on an indication that the mobile computing device is coupled to a dock, wherein the dock is to comprise a cooling fan proximate to a hotspot on a back skin of the mobile computing device, wherein the cooling fan comprises a plurality of fan blades, wherein the plurality of fan blades comprises a plurality of straight blades and a plurality of curved blades, wherein a first straight blade of the plurality of straight blades overlaps at least two curved blades of the plurality of curved blades.

16. The method of claim 15, wherein the cooling fan is physically adjacent to the hotspot on the back skin of the mobile computing device.

17. The method of claim 15, wherein the cooling fan is thermally coupled or connected to the hotspot on the back skin of the mobile computing device.

18. The method of claim 15, wherein one or more heat generating components of the mobile computing device are to generate the hotspot, wherein the one or more heat generating components of the mobile computing device comprise one or more of: a System On Chip (SOC) device; a processor, having one or more processor cores; and memory.

19. A system comprising:
a mobile computing device comprising a display device to display one or more images; and
logic, the logic at least partially comprising hardware logic, to cause an increase in performance of the mobile computing device based at least in part on an indication that the mobile computing device is coupled to a dock, wherein the dock is to comprise a cooling fan proximate to a hotspot on a back skin of the mobile computing device, wherein the cooling fan is to comprise a plurality of fan blades, wherein the plurality of fan blades are to comprise a plurality of straight blades and a plurality of curved blades, wherein a first straight blade of the plurality of straight blades is to overlap at least two curved blades of the plurality of curved blades.

20. The system of claim 19, wherein the cooling fan is to be physically adjacent to the hotspot on the back skin of the mobile computing device.

21. The system of claim 19, wherein the cooling fan is to be thermally coupled or connected to the hotspot on the back skin of the mobile computing device.

22. The system of claim 19, wherein one or more heat generating components of the mobile computing device are to generate the hotspot, wherein the one or more heat generating components of the mobile computing device are to comprise one or more of: a System On Chip (SOC) device; a processor, having one or more processor cores; and memory.

* * * * *